United States Patent
Barber et al.

(10) Patent No.: US 6,746,577 B1
(45) Date of Patent: Jun. 8, 2004

(54) METHOD AND APPARATUS FOR THICKNESS CONTROL AND REPRODUCIBILITY OF DIELECTRIC FILM DEPOSITION

(75) Inventors: Bradley Paul Barber, Chatham, NJ (US); Linus Albert Fetter, Morganville, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/465,880

(22) Filed: Dec. 16, 1999

(51) Int. Cl.⁷ .............................................. C23C 14/34
(52) U.S. Cl. ......................... 204/192.13; 204/192.18; 204/192.22; 204/298.03; 427/8; 427/9
(58) Field of Search ....................... 204/192.13, 192.18, 204/192.22, 298.03; 427/8, 9

(56) References Cited

U.S. PATENT DOCUMENTS

| | | | | |
|---|---|---|---|---|
| 2,303,457 A | | 12/1942 | Harding et al. ............. 172/239 |
| 4,166,784 A | * | 9/1979 | Chapin et al. .......... 204/192.13 |
| 4,502,932 A | | 3/1985 | Kline et al. ........... 204/192 EC |
| 4,556,812 A | | 12/1985 | Kline et al. .................. 310/324 |
| 4,640,756 A | * | 2/1987 | Wnag et al. ........... 204/192.18 |
| 4,719,383 A | | 1/1988 | Wang et al. ................. 310/324 |
| 4,890,370 A | | 1/1990 | Fukuda et al. ............. 29/25.35 |
| 4,988,957 A | | 1/1991 | Thompson et al. ..... 331/107 A |
| 5,075,641 A | | 12/1991 | Weber et al. ........... 331/108 C |
| 5,108,569 A | * | 4/1992 | Gilboa et al. .......... 204/192.13 |
| 5,119,760 A | | 6/1992 | McMillan et al. .......... 118/722 |
| 5,126,028 A | * | 6/1992 | Hurwitt et al. ........ 204/192.13 |
| 5,166,646 A | | 11/1992 | Avanic et al. .......... 331/107 A |
| 5,185,589 A | | 2/1993 | Krishnaswamy et al. ... 333/133 |
| 5,231,327 A | | 7/1993 | Ketcham .................... 310/366 |
| 5,232,571 A | | 8/1993 | Braymen ............... 204/192.22 |
| 5,233,259 A | | 8/1993 | Krishnaswamy et al. ... 310/324 |
| 5,283,458 A | | 2/1994 | Stokes et al. ................ 257/416 |
| 5,291,159 A | | 3/1994 | Vale ............................ 333/188 |
| 5,294,898 A | | 3/1994 | Dworsky et al. ............ 333/187 |
| 5,334,960 A | | 8/1994 | Penunuri ..................... 333/193 |
| 5,348,617 A | | 9/1994 | Braymen ..................... 156/644 |
| 5,367,308 A | | 11/1994 | Weber ......................... 343/700 |
| 5,373,268 A | | 12/1994 | Dworsky et al. ........... 333/187 |
| 5,381,385 A | | 1/1995 | Greenstein .................. 367/140 |
| 5,403,701 A | | 4/1995 | Lum et al. .................. 430/315 |
| 5,404,628 A | | 4/1995 | Ketcham ................... 29/25.35 |

(List continued on next page.)

OTHER PUBLICATIONS

Rossnagel, S.M., *Sputter deposition for semiconductor manufacturing*, 1999, pp. 163–179,IBM J. Res. Develop. vol. 43, No. 1/2.

*Primary Examiner*—Rodney G. McDonald

(57) ABSTRACT

The invention embodies a method and apparatus for controlling the thickness of a dielectric film formed by physical vapor deposition (PVD). The method compensates for the continuously varying electrical load conditions inherent in dielectric deposition via PVD. The method can be implemented through three different stages. Initially, the system power supply can be configured to operate in either constant current or constant voltage mode, herein referred to as constant supply parameter mode. Next, a gas composition which minimizes excursions in system impedance under these conditions is empirically determined. Finally, a test deposition can be performed using the constant parameter power supply mode and the gas mixture. This deposition is performed while tracking and summing the energy delivered to the system. The thickness of the deposited film is subsequently measured, and from these data a thickness-per-unit-energy relationship is determined. Depositions of predictable film thickness are then reproducibly performed under these established conditions. In practice, a given deposition is terminated at a value of total energy as determined by the established thickness per unit energy value and the required film thickness. The method is much more reliable than the current art technique of deposition at constant power for a fixed time.

31 Claims, 2 Drawing Sheets

U.S. PATENT DOCUMENTS

| | | |
|---|---|---|
| 5,438,554 A | 8/1995 | Seyed-Bolorforosh et al. .................... 367/140 |
| 5,446,306 A | 8/1995 | Stokes et al. ................ 257/416 |
| 5,552,655 A | 9/1996 | Stokes et al. ................ 310/330 |
| 5,587,620 A | 12/1996 | Ruby et al. .................. 310/346 |
| 5,596,239 A | 1/1997 | Dydyk ........................ 310/311 |
| 5,617,065 A | 4/1997 | Dydyk ........................ 333/186 |
| 5,630,949 A | 5/1997 | Lakin ........................... 216/61 |
| 5,646,583 A | 7/1997 | Seabury et al. .............. 333/187 |
| 5,692,279 A | 12/1997 | Mang et al. ................ 29/25.35 |
| 5,698,928 A | 12/1997 | Mang et al. ................. 310/322 |
| 5,702,775 A | 12/1997 | Anderson et al. .............. 428/1 |
| 5,714,917 A | 2/1998 | Ella ............................ 332/144 |
| 5,760,663 A | 6/1998 | Pradal ........................ 333/187 |
| 5,780,713 A | 7/1998 | Ruby ........................... 73/1.82 |
| 5,789,845 A | 8/1998 | Wadaka et al. ............. 310/334 |
| 5,801,476 A | 9/1998 | Sturzebecher et al. ...... 310/324 |
| 5,821,833 A | 10/1998 | Lakin ........................ 333/187 |
| 5,853,601 A | 12/1998 | Krishaswamy et al. ......... 216/2 |
| 5,858,086 A | 1/1999 | Hunter ........................ 117/84 |
| 5,864,261 A | 1/1999 | Weber ........................ 333/187 |
| 5,871,805 A | 2/1999 | Lemelson ...................... 427/8 |
| 5,872,493 A | 2/1999 | Ella ............................ 333/191 |
| 5,873,153 A | 2/1999 | Ruby et al. ................. 29/25.35 |
| 5,873,154 A | 2/1999 | Ylilammi et al. ........... 29/25.35 |
| 5,882,468 A | 3/1999 | Crockett et al. ............. 156/345 |
| 5,883,575 A | 3/1999 | Ruby et al. ............... 340/572.5 |
| 5,884,378 A | 3/1999 | Dydyk ....................... 29/25.35 |
| 5,894,647 A | 4/1999 | Lakin ........................ 29/25.35 |
| 5,910,756 A | 6/1999 | Ella ............................ 333/133 |
| 5,911,856 A * | 6/1999 | Suzuki et al. ........... 204/192.13 |
| 5,928,598 A | 7/1999 | Anderson et al. ............ 264/446 |
| 5,942,958 A | 8/1999 | Lakin ......................... 333/189 |
| 5,963,856 A | 10/1999 | Kim ........................... 455/307 |
| 6,051,907 A | 4/2000 | Ylilammi .................... 310/312 |
| 6,060,818 A | 5/2000 | Ruby et al. .................. 310/363 |
| 6,081,171 A | 6/2000 | Ella ............................ 333/189 |
| 6,087,198 A | 7/2000 | Panasik ........................ 438/51 |
| 6,127,768 A | 10/2000 | Stoner et al. ............ 310/313 A |
| 6,150,703 A | 11/2000 | Cushman et al. ............ 257/415 |
| 6,198,208 B1 | 3/2001 | Yano et al. .................. 310/358 |
| 6,204,737 B1 | 3/2001 | Ella ............................ 333/187 |
| 6,215,375 B1 | 4/2001 | Larson, III et al. .......... 333/187 |

\* cited by examiner

METHOD AND APPARATUS FOR THICKNESS CONTROL AND REPRODUCIBILITY OF DIELECTRIC FILM DEPOSITION

FIELD OF THE INVENTION

The invention pertains to the field of electronic device fabrication. More particularly, the invention pertains to processes of deposition of dielectric materials by physical vapor deposition.

BACKGROUND OF THE INVENTION

Dielectrics are a class of materials characterized, in part, by their high resistance to the flow of electrical current. This characteristic introduces certain challenges to the formation of thin films using these materials, such as the ability to reliably produce a precise film thickness. Of particular interest is the deposition of a class of dielectrics known as piezo-electrics. Among applications of piezo-electric materials is the fabrication of bulk acoustic resonators, and, in such devices, the thickness of the piezo-electric material is of critical importance to device performance.

In practice, the piezo-electric material is often deposited via physical vapor deposition (PVD). PVD is a process wherein a target material is subjected to bombardment by electrically-excited ions in a vacuum chamber. This ion bombardment erodes the target and produces a vapor of the target material which ultimately coats all exposed surfaces, including that of the substrate, with a film of the target material. The electrical excitation is provided by an external power source which is most often configured to supply the deposition system with constant power for a fixed length of time. Under an assumption that the deposition rate is constant with applied power, the net deposited film thickness is thus predictable.

However, while the dielectric coating constitutes the desired deposition of the target material on the substrate, its accumulation on other system surfaces contributes to continuous fluctuations in the net system impedance seen by the power supply. These impedance variations automatically induce corrections in the power supply's output to enable it to maintain the requested constant power level. These corrections directly affect the stability of the deposition rate, resulting in excursions from the expected constant rate and thus errors in the deposited film thickness. For deposition of very thin films, these errors may be inconsequential; however, for the relatively thicker films (greater than 1 micron) required in some applications, including bulk acoustic wave devices, these rate fluctuations accumulate to yield unacceptable errors in net film thickness. The total thickness of the piezo-electric material in these devices is often ten times the thickness of the same material in other types of devices. As a result, deposition times are extended, thus allowing for increased errors in total thickness. Other techniques for in situ monitoring thin-film depositions (mass oscillators or laser probe systems, for example) are inappropriate or difficult to adapt to this technology. Therefore, a need exists for an accurate and reproducible method to predict the thickness of such films.

SUMMARY OF THE INVENTION

The invention embodies a method and apparatus for controlling the thickness of a dielectric film formed by physical vapor deposition (PVD). The method compensates for the continuously varying electrical load conditions inherent in dielectric deposition via PVD. The method can be implemented through three different stages. Initially, the system power supply can be configured to operate in either constant current or constant voltage mode, herein referred to as constant supply parameter mode. Next, a gas composition which minimizes excursions in system impedance under these conditions is empirically determined. Finally, a test deposition can be performed using the constant parameter power supply mode and the gas mixture. This deposition is performed while tracking and summing the energy delivered to the system. The thickness of the deposited film is subsequently measured, and from these data a thickness-per-unit-energy relationship is determined. Depositions of predictable film thickness are then reproducibly performed under these established conditions. In practice, a given deposition is terminated at a value of total energy as determined by the established thickness per unit energy value and the required film thickness. The method is much more reliable than the current art technique of deposition at constant power for a fixed time.

DESCRIPTION OF THE PREFERRED EMBODIMENT

A method of controlling the deposited thickness of a dielectric uses measurement and control of the electrical conditions used to deposit the material as a way to reproducibly predict the deposited film thickness. The embodiments described here center on a particular subset of this class of materials, but the method can be generalized to apply to any dielectric deposited by physical vapor deposition (PVD).

Figure 1:
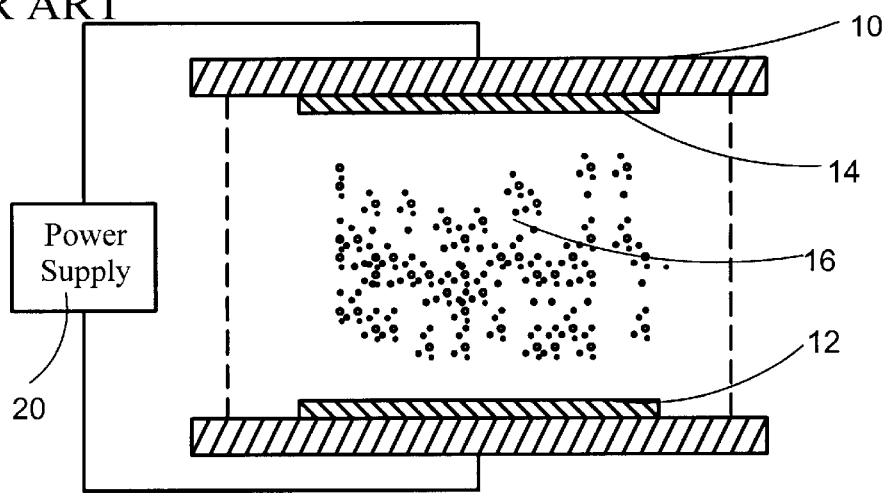
FIG. 1 shows an inside of a vacuum chamber during PVD as known in the prior art.

Referring to FIG. 1, an apparatus used in the current art for physical vapor deposition of a dielectric is shown. Inside a vacuum chamber (10) is a substrate (12) upon which a dielectric material is to be deposited. A gas or gas mixture is introduced into the vacuum chamber (10). A power supply (20) provides the electrical energy to the vacuum chamber (10) to initiate and sustain the deposition. The energy received from the power supply (20) creates a plurality of electrically excited ions (16) inside the vacuum chamber (10). The plurality of electrically excited ions (16) strike the target material (14) creating a vapor of the target material (14). The vaporous target material coats all exposed surfaces in the vacuum chamber (10) including the surface of the substrate (12) and interior surfaces of the vacuum chamber (10). The deposition normally ceases when a pre-set time limit is achieved.

One prior art technique for achieving thickness control and reproducibility is to deposit the film at constant power for a fixed time. Due to the continuously changing load (i.e., the vacuum system itself) during dielectric PVD, a power supply must continuously adjust its supply parameters (i.e. current and/or voltage output) to maintain this constant power delivery. These automatic corrections to the supply parameters may be made several times per second during a given deposition. However, while power is linear with respect to current and voltage, the deposition rate may not be so. The rate variations which these corrections induce are cumulative, and over an extended deposition can yield errors in thickness as large as 20%. Errors of this magnitude cause unacceptable variations in the operating frequency of a resonant device.

Figure 2:
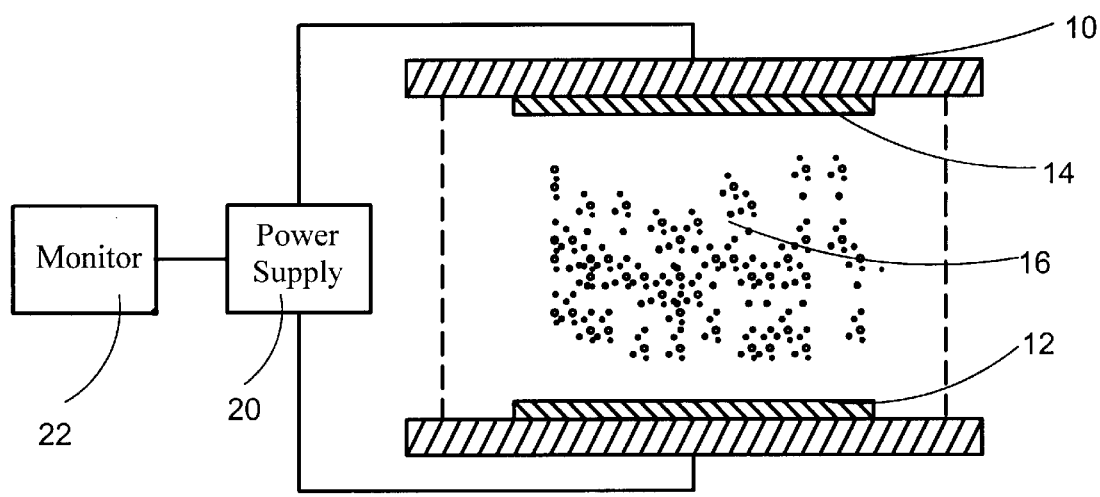
FIG. 2 shows an embodiment of the apparatus of the current invention.

Referring to FIG. 2, an apparatus of the current invention is shown. The substrate (12) within a vacuum chamber (10) is any material, such as silicon, upon which a target material (14) is to be deposited. A power supply (20) provides the electrical energy to the vacuum chamber (10) to sustain the deposition. The power supply (20) is configured to operate in a constant supply parameter mode and to deliver the total energy to the system. A monitor (22) is interfaced with the power supply (20) to monitor system impedance. The monitor (22) is preferably a computer. The energy received from the power supply (20) creates a plurality of electrically excited ions (16) inside the vacuum chamber (10) which strike the target material (14) and vaporize it.

Figure 3:
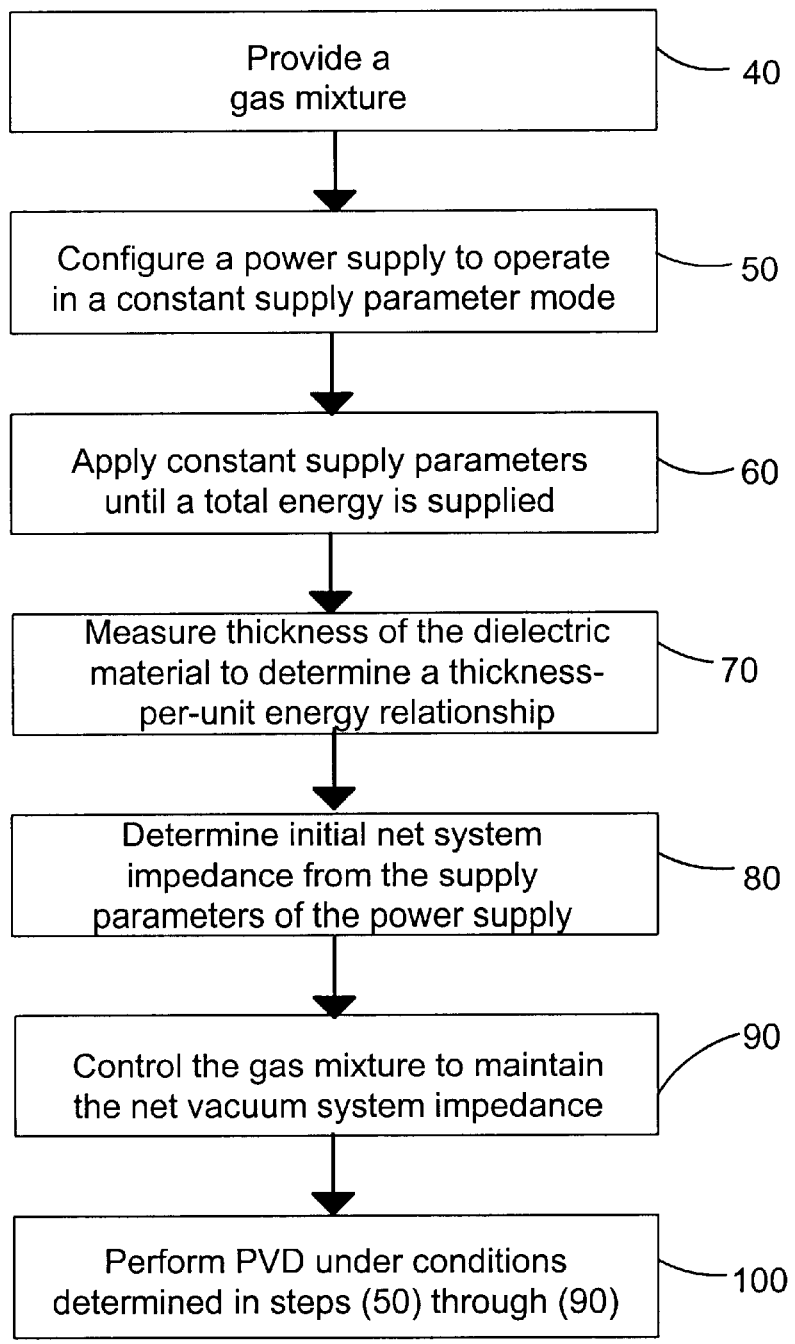
FIG. 3 shows a flowchart of a method of the present invention.

Referring also to FIG. 3, the vaporization and subsequent deposition of the target material (14) is tightly controlled by a method which reliably predicts the deposited thickness of a dielectric material on a substrate (12). In one embodiment, the target material (14) for deposition of aluminum nitride is aluminum. In another embodiment, the target material (14) for deposition of zinc oxide is zinc.

The method comprises three components which together compensate for the variations in the electrical environment that occur during the deposition. These three components are: 1) operation of the system power supply in a constant supply parameter mode, 2) minimization of variations in net system impedance by controlling the composition of a gas mixture, and 3) determination of the total energy to be supplied to the system during deposition. Any one of these components by itself provides improved control for deposited film thickness, although combining all three components is preferable.

A gas mixture is provided in step (40). In the example depositing aluminum nitride using aluminum as the target material (14), the preferred gas mixture is argon and nitrogen. Alternatively, if zinc oxide is being deposited using a target material (14) of zinc, the preferred gas mixture is argon and oxygen. In step (50), the power supply (20) is configured to operate in a constant supply parameter mode. Preferred supply parameters include current, power, and voltage. A set of experiments is performed prior to any deposition to determine the optimal parameters necessary for deposition. A preferred way to operate the power supply in a constant supply parameter mode is to program the power supply for a specific constant parameter. If, for example, constant current is chosen as the constant supply parameter, the power supply is programmed to provide constant current during deposition, and the voltage will be varied during deposition to maintain the current at this preselected value. Similarly, if constant voltage is used as the constant supply parameter, the power supply is programmed to supply constant voltage, and the current is varied to keep the voltage constant. In either of these cases, the power will fluctuate with the changing voltage or current. If power is chosen as the constant supply parameter, then both current and voltage will be varied during deposition to keep the power (Power=voltage times current) a constant.

If the power supply is operating in constant current mode, a constant number of a plurality of electrically excited ions (16) bombard the target material (14) per unit time during PVD in step (100). Since the number of particles liberated from the target material (14) is a strong function of the number of particles incident upon it, the ejection rate, and consequently the deposition rate, is more controllable than in previous PVD processes.

In constant current mode, however, the power supply (20) constantly adjusts the applied voltage as a function of the load seen to deliver the number of ions (16) required to maintain a constant current. This adjustment results in a change in instantaneous power (energy per unit time) delivered to the system. Because the deposition rate is not necessarily linear with power, this adjustment causes a fluctuation in the momentary deposition rate. These errors accumulate over the term of the deposition, causing errors in total thickness.

The monitor (22), which is interfaced with the power supply (20), determines the initial net system impedance Z from the supply parameters of the power supply in step (80). Data is collected on current, voltage, and power values from the power supply to calculate the impedance for display as a function of a time. An example of a specific program commercially available to perform these calculations is Lab View (National Instruments Corporation, Austin, Tex.).

As the second component of the method, the gas mixture is controlled in step (90). By adjusting the composition of the gas mixture, excursions in the vacuum chamber's (10) net impedance are minimized without affecting the required film qualities of the deposited material. Preferably, a gas mixture which minimizes variations in the net impedance is determined for use in further depositions.

To compensate for the errors which result from the fluctuations in the momentary deposition rate in constant supply parameter mode, the third component uses a total energy delivered to the target material (14) during deposition in step (60). This step is preferably accomplished while a constant supply parameter is being applied. Also, the gas mixture is controlled to maintain the net vacuum system impedance approximating the initial net system impedance. The total energy is preferably supplied by programming the power supply to run during the deposition until it delivers a certain amount of energy, at which point the deposition ceases.

Total energy depositions are used to determine a thickness-per-unit energy relationship in step (70) in order to calculate the total energy required for a given film thickness. This relationship is determined by multiple test depositions under the minimal impedance excursion, constant supply parameter, and total energy constraint. Measuring the thickness of the resulting film and forming the quotient of total thickness divided by total energy results in a number indicating thickness per unit energy. Normalization yields a number measured, for example, in Angstroms (Å) per kilojoule, that allows the user to calculate the total deposited energy required to achieve a required film thickness. This relationship is used to recalculate a total energy needed for a given thickness.

The system is now fully prepared and calibrated for the deposition of a film with critical thickness requirements. For this deposition, the power supply is configured for constant parameter operation and set to deliver the total energy needed to achieve the required film thickness. The gas mixture which initially minimizes impedance excursions is admitted to the chamber. The deposition is initiated in step (100). A constant gas mixture is preferably maintained throughout deposition. The energy received from the power supply (20) creates a plurality of electrically excited ions (16) inside the vacuum chamber (10) which strike the target material (14) and vaporize it. The vaporized target material

(14) coats all exposed surfaces in the vacuum chamber (10) including the surface of the substrate (12) and interior surfaces of the vacuum chamber (10). The deposition halts automatically when the desired total energy has been applied to the system.

An example of the invention's reduction to practice follows. It will be understood that the parameters mentioned here are very system specific, and would need to be determined experimentally depending on the specific equipment involved within the teachings of the invention. For deposition of the piezo-electric Aluminum Nitride (AlN), previous experience has indicated that adequate deposition rates are achieved using 3000 watts of input power. As the initial preparatory step, then, the power supply current output is adjusted to the level that provides 3000 W of power to the target in step (50). This value is used as the "constant current" setting. Total current in this example is preferably about 13 amps, or 60 mA per square centimeter. If using the constant power or voltage mode, the required supply power or voltage level is determined in a similar fashion.

As the second step, a gas mixture which minimizes system impedance fluctuations is provided in step (40). For the deposition of AlN on silicon, the gas mixture is preferably composed of argon and nitrogen. The gas mixture is determined empirically by adjusting the gas flow rates at the gas feeds from the nitrogen and argon sources while operating the system in the previously-determined constant supply parameter mode and determining the net vacuum system impedance with the monitor (22) in step (80). The optimal mixture of argon to nitrogen is 37.1 sccm (standard cubic centimeters per minute) argon and 26.4 sccm nitrogen, but this mixture changes during the lifetime of the target material (14). When the deposition is initialized, the system impedance is between 15 ohms and 18 ohms (depending on total pressure). The gas ratio is adjusted during the deposition process in step (90) to keep the impedance preferably to within an ohm of its value at the beginning of the deposition.

As the third step, a calibration deposition is performed. A thickness-per-unit-energy relationship is determined by measuring the thickness of the deposited material in step (70). With the power supply operated at the established current level and the gas mixture set as previously determined, a test deposition is performed and terminated at a certain total energy. The thickness of the resulting dielectric film is carefully measured, and these data used to determine the total energy required to deposit the measured film thickness. Normalizing the quotient of this measured thickness and the input energy yields a thickness per unit energy value which remains relatively constant for the established supply parameters and gas mixture. When aluminum nitride is deposited on silicon using aluminum as the target material (14), the thickness per unit energy relationship is approximately 4 Angstroms per kilojoule. This number changes during the lifetime of the target material 14).

The deposition of aluminum nitride occurs in step (100) under the conditions described above. The power supply is configured for constant parameter operation in step (50) and set to deliver the total energy needed to achieve the required film thickness in step (60). The gas mixture, provided in step (40) to minimize impedance excursions, is admitted to the chamber. The deposition is initiated, and ceases automatically when the desired total energy has been supplied.

Additional embodiments of this invention include deposition under minimized variations in net impedance, constant supply parameter mode and total energy conditions separately. Each of these methods includes the step of performing PVD (100). Achieving a stable deposition rate under minimized variations in net impedance adds the steps of providing a gas mixture (40), determining initial net vacuum system impedance (80) and controlling the composition of the gas mixture to maintain a net vacuum system impedance approximating the initial net vacuum system impedance (90). Utilizing a constant supply parameter mode to achieve a stable deposition rate adds step (50) to operate the power supply for constant supply parameter mode. Controlling the energy delivered to a substrate during deposition adds the steps of operating the power supply until a total energy is supplied (60) and measuring the thickness of the dielectric material to determine a thickness-per-unit-energy relationship (70). Each of these methods may also utilize additional steps in the process to further control the deposition rate.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of depositing a dielectric material on a substrate using a deposition apparatus comprising a vacuum chamber, a power supply having controllable supply parameters, and a monitor coupled to the power supply for monitoring the supply parameters, in which the dielectric material and substrate are enclosed in the vacuum chamber and subjected to bombardment by electrically-excited ions by electrical excitation provided by the power supply, the method comprising the steps of:
   a) providing a gas mixture in the vacuum chamber;
   b) configuring the power supply such that said power supply operates in a constant supply parameter mode;
   c) determining a net vacuum system impedance in said vacuum chamber from the supply parameters of the power supply;
   d) operating a power supply at a constant supply parameter until a certain amount of total energy has been supplied, while controlling the gas mixture to maintain the net vacuum system impedance; and
   e) measuring the thickness of the dielectric material deposited on the substrate to determine a thickness-per-unit-energy relationship.

2. The method of claim 1, in which the thickness-per-unit-energy relationship determined in step e is used to determine the amount of total energy in step d, and the steps are repeated for further depositions.

3. The method of claim 2, further comprising maintaining a constant gas mixture in said further depositions.

4. The method of claim 3, further comprising determining said constant gas mixture to minimize variations in step d and said further depositions are performed with the constant gas mixture.

5. The method of claim 1 wherein said constant supply parameter is selected from the group consisting of current and voltage.

6. The method of claim I wherein said dielectric material applied to said substrate is used in a bulk acoustic wave device.

7. The method of claim 1 wherein said dielectric material is a piezo-electric material.

8. The method of claim 7 wherein said piezo-electric material is aluminum nitride.

9. The method of claim 7 wherein said piezo-electric material is zinc oxide.

10. The method of claim 1 wherein aluminum is provided as a target material for depositing the dielectric material on the substrate.

11. The method of claim 1 wherein zinc is provided as a target material for depositing the dielectric material on the substrate.

12. The method of claim 1 wherein said gas mixture comprises argon and nitrogen.

13. The method of claim 1 wherein said gas mixture comprises argon and oxygen.

14. A method of depositing a dielectric material on a substrate using a deposition apparatus comprising a vacuum chamber, a power supply having controllable supply parameters, and a monitor coupled to the power supply for monitoring the supply parameters, in which the dielectric material and substrate are enclosed in the vacuum chamber and subjected to bombardment by electrically-excited ions by electrical excitation provided by the power supply, the method comprising the steps of:
 a) providing a gas mixture in the vacuum chamber;
 b) determining a net vacuum system impedance in said vacuum chamber from the supply parameters of the power supply; and
 c) performing a physical vapor deposition process while controlling the gas mixture to maintain the net vacuum system impedance of said vacuum chamber.

15. The method of claim 14 further comprising the step of configuring the power supply such that said power supply operates in a constant supply parameter mode.

16. The method of claim 15 wherein a constant supply parameter is selected from the group consisting of current and voltage.

17. The method of claim 14 wherein said dielectric material applied to said substrate is used in a bulk acoustic wave device.

18. The method of claim 14 wherein said dielectric material is a piezo-electric material.

19. The method of claim 18 wherein said piezo-electric material is aluminum nitride.

20. The method of claim 18 wherein said piezo-electric material is zinc oxide.

21. The method of claim 14 wherein aluminum is provided as a target material for depositing the dielectric material on the substrate.

22. The method of claim 14 wherein said gas mixture comprises argon and nitrogen.

23. The method of claim 14 wherein zinc is provided as a target material for depositing the dielectric material on the substrate.

24. The method of claim 14 wherein said gas mixture comprises argon and oxygen.

25. A method of depositing a dielectric material on a substrate using a deposition apparatus comprising a vacuum chamber, a power supply having controllable supply parameters, and a monitor coupled to the power supply for monitoring the supply parameters, in which the dielectric material and substrate are enclosed in the vacuum chamber and subjected to bombardment by electrically-excited ions by electrical excitation provided by the power supply, the method comprising the steps of:
 a) configuring the power supply such that said power supply operates in a constant supply parameter mode wherein a constant supply parameter is selected from the group consisting of current and voltage;
 b) performing a physical vapor deposition process while applying the constant supply parameter;
 c) providing a gas mixture in the vacuum chamber;
 d) determining a net vacuum system impedance in said vacuum chamber from the supply parameters of the power supply; and
 e) controlling the gas mixture during physical vapor deposition to maintain the net vacuum system impedance.

26. The method of claim 25 wherein said dielectric material applied to said substrate is used in a bulk acoustic wave device.

27. The method of claim 25 wherein said dielectric material is a piezo-electric material.

28. The method of claim 27 wherein said piezoelectric material is aluminum nitride.

29. The method of claim 27 wherein said piezo-electric material is zinc oxide.

30. The method of claim 25 wherein aluminum is provided as a target material for depositing the dielectric material on the substrate.

31. The method of claim 25 wherein zinc is provided as a target material for depositing the dielectric material on the substrate.

* * * * *